United States Patent
Lorenzoni et al.

(10) Patent No.: US 12,490,376 B2
(45) Date of Patent: Dec. 2, 2025

(54) COMPONENT CARRIER WITH ASYMMETRIC BUILD-UP AND METHODS FOR DETERMINING A DESIGN OF AND MANUFACTURING THE SAME

(71) Applicant: AT&S (China) Co. Ltd., Shanghai (CN)

(72) Inventors: Diego Lorenzoni, Novara (IT); Mikael Andreas Tuominen, Pernio (FI); Seok Kim Tay, Singapore (SG)

(73) Assignee: AT&S (China) Co. Ltd., Shanghai (CN)

( * ) Notice: Subject to any disclaimer, the term of this patent is extended or adjusted under 35 U.S.C. 154(b) by 186 days.

(21) Appl. No.: 18/150,188

(22) Filed: Jan. 4, 2023

(65) Prior Publication Data
US 2023/0217589 A1    Jul. 6, 2023

(30) Foreign Application Priority Data
Jan. 5, 2022 (CN) .......................... 202210006528.4

(51) Int. Cl.
*H05K 1/18* (2006.01)
*H05K 1/02* (2006.01)
(Continued)

(52) U.S. Cl.
CPC .......... *H05K 1/0298* (2013.01); *H05K 1/188* (2013.01); *H05K 3/4038* (2013.01); *H05K 3/421* (2013.01);
(Continued)

(58) Field of Classification Search
CPC ...... H05K 1/0298; H05K 1/115; H05K 1/188; H05K 3/4038; H05K 3/421;
(Continued)

(56) References Cited

U.S. PATENT DOCUMENTS 5,311,406 A * 5/1994 Snodgrass .............. H05K 1/024
257/E23.173
9,401,330 B1 * 7/2016 Jiang ....................... H01L 23/12
(Continued)

FOREIGN PATENT DOCUMENTS

CN    101783333 A    7/2010

*Primary Examiner* — Steven T Sawyer
(74) *Attorney, Agent, or Firm* — Robert A. Blaha; Smith Tempel Blaha LLC

(57) ABSTRACT

A component carrier with an asymmetric build-up, which includes (a) a core; (b) a first stack at a first main surface of the core, the first stack having at least one first electrically conductive layer structure and a plurality of first electrically insulating layer structures; and (c) a second stack at a second main surface of the core, the second stack having at least one second electrically conductive layer structure and a plurality of second electrically insulating layer structures. At least two of the second electrically insulating layer structures are in direct contact with each other and each one of these electrically insulating layer structures has a smaller thickness than and/or includes a different material property than one of the first electrically insulating layer structures. Further described are methods for designing and manufacturing such an asymmetric component carrier.

20 Claims, 4 Drawing Sheets

(51) Int. Cl.
*H05K 3/40* (2006.01)
*H05K 3/42* (2006.01)
*H05K 1/03* (2006.01)

(52) U.S. Cl.
CPC ... *H05K 1/0306* (2013.01); *H05K 2201/0191* (2013.01); *H05K 2201/0355* (2013.01)

(58) Field of Classification Search
CPC ... H05K 2201/0355; H05K 2201/0191; H05K 3/4673; H05K 1/0256; H05K 1/0306; H05K 1/0313; H05K 1/181; H05K 1/183; H05K 1/185; H05K 2201/0187
See application file for complete search history.

(56) References Cited

U.S. PATENT DOCUMENTS

| | | | |
|---|---|---|---|
| 2013/0307162 A1* | 11/2013 | Shizuno | H05K 3/465 257/774 |
| 2014/0182895 A1* | 7/2014 | Lee | H05K 1/0271 174/251 |
| 2015/0357276 A1* | 12/2015 | Shimizu | H05K 3/0055 361/783 |
| 2016/0172287 A1* | 6/2016 | Arisaka | H05K 1/181 257/774 |
| 2017/0354044 A1 | 12/2017 | Kurahashi | |
| 2018/0263105 A1* | 9/2018 | Leitgeb | H05K 3/4688 |
| 2022/0061158 A1* | 2/2022 | Jung | H05K 1/186 |

\* cited by examiner

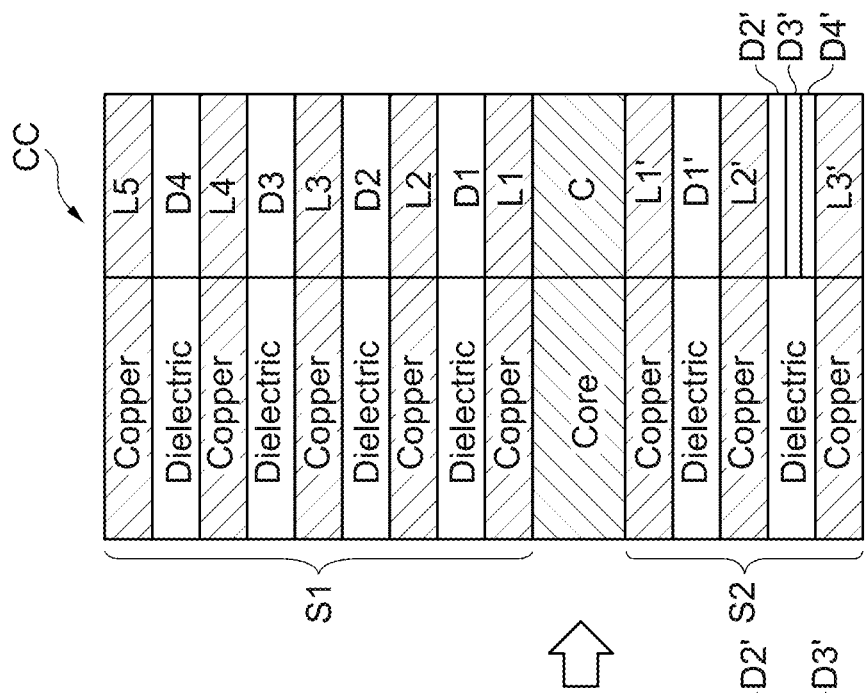
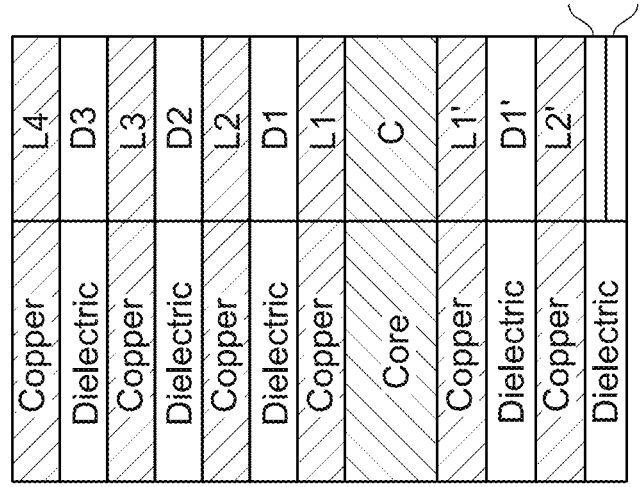
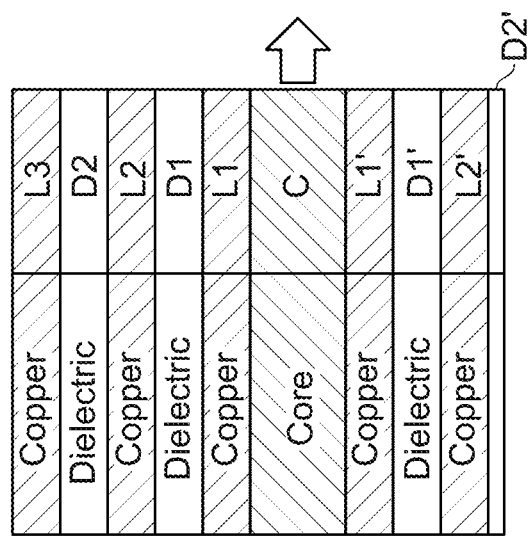

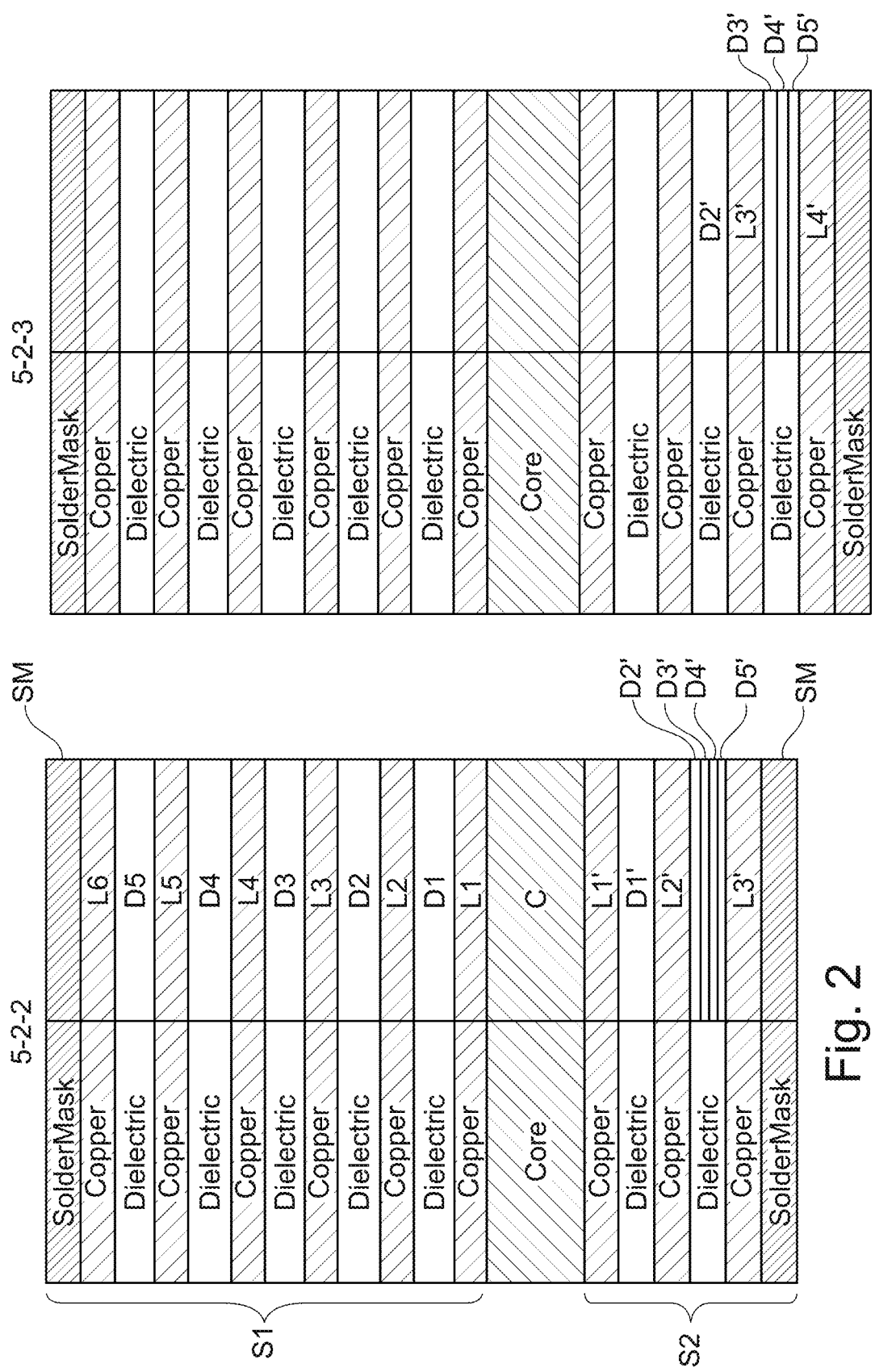

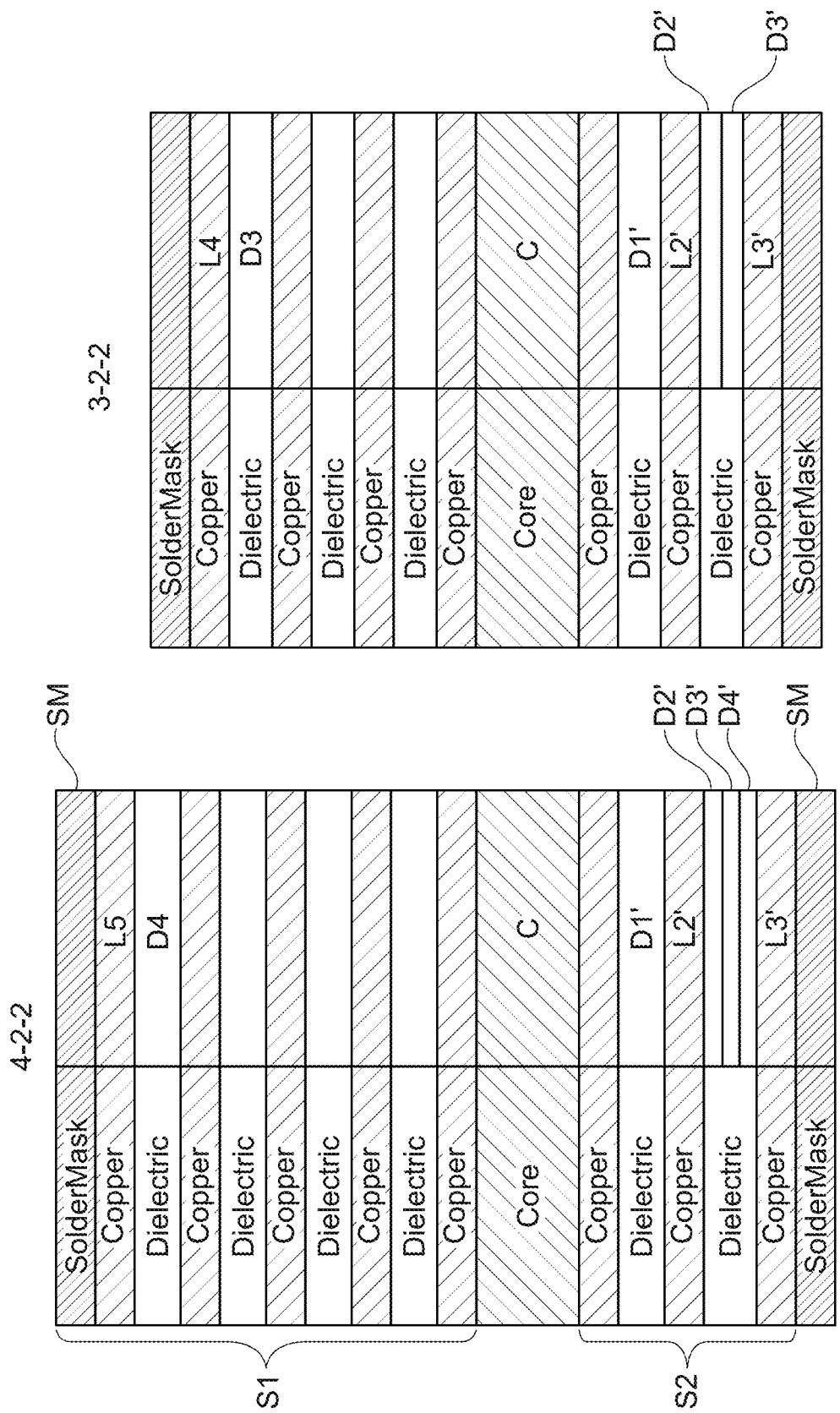

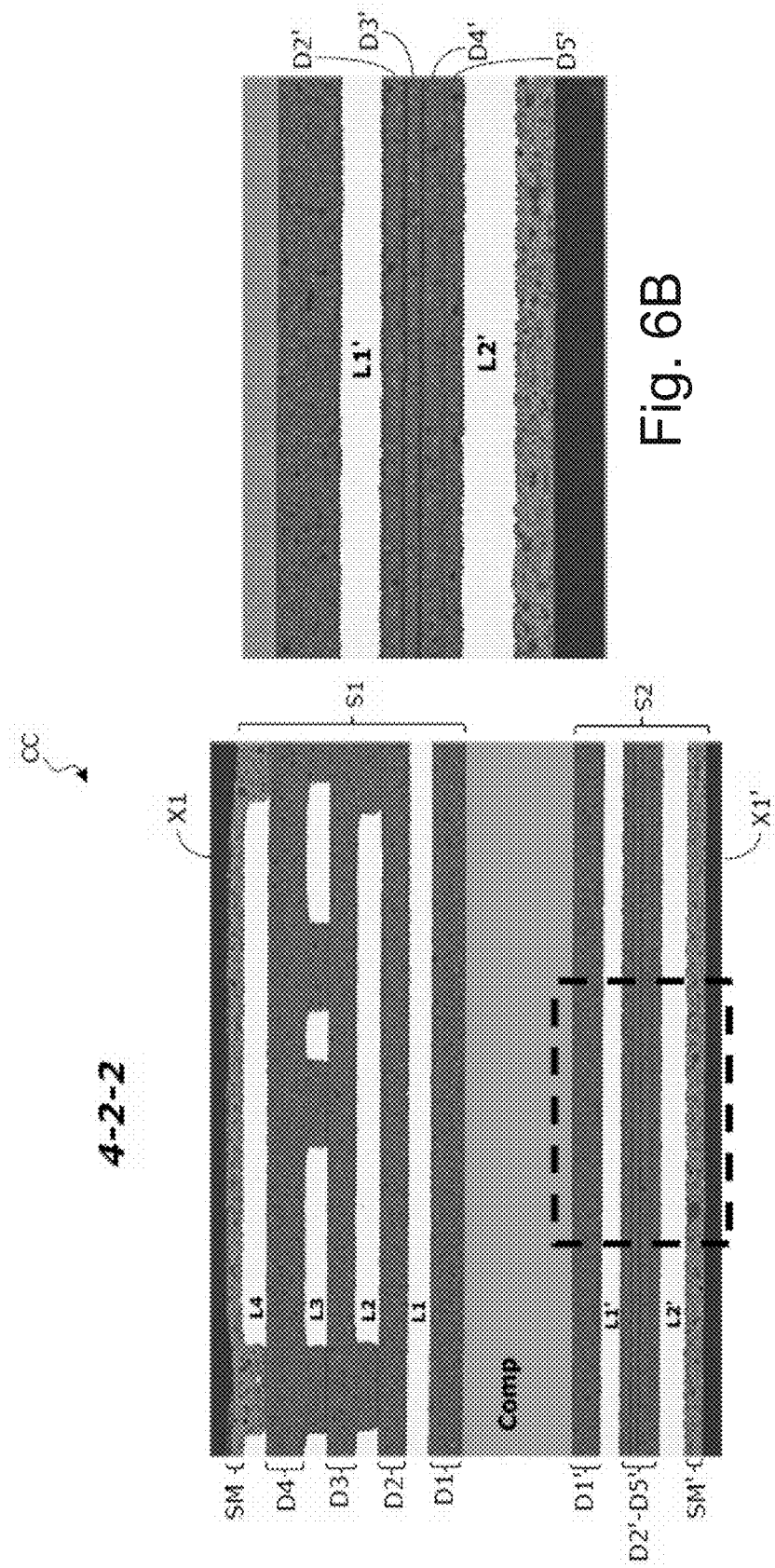

COMPONENT CARRIER WITH ASYMMETRIC BUILD-UP AND METHODS FOR DETERMINING A DESIGN OF AND MANUFACTURING THE SAME

CROSS-REFERENCE TO RELATED APPLICATIONS

This application claims the benefit of the filing date of Chinese Patent Application No. 202210006528.4 filed Jan. 5, 2022, the disclosure of which is hereby incorporated herein by reference.

TECHNICAL FIELD

Embodiments disclosed herein relate to component carriers onto which electronic components can be mounted and/or into which electronic components can be embedded in order to form an electronic assembly. Further embodiments relate to methods for designing and manufacturing such a component carrier.

BACKGROUND ART

A component carrier such as a Printed Circuit Boards (PCB) is a support structure for at least one electronic component forming an electronic assembly respectively an electronic circuit. A component carrier comprises a stack of at least one electrically insulating or dielectric layer structure and at least one electrically conductive layer structure, typically made from a metal such as copper. Conductor traces representing an interconnecting wiring for a supported component are formed by means of an appropriate structuring or patterning of the electrically conductive layer structure which is provided on top or beneath an electrically insulating layer. An electronic component may be mounted on an upper or lower surface of a component carrier. In some applications, an electronic component is embedded at least partially within (the volume of) a component carrier.

A multilayer component carrier is a laminated stack consisting of several (patterned) electrically conductive layer structures and several electrically insulating or dielectric layer structures in an alternating sequence. For electrically connecting different electrically conductive layer structures there may be used metallized vias extending at least through one electrically insulating layer.

In order to control an unwanted warpage of a component carrier it is known to build up a multilayer component carrier with a layer structure being symmetric with respect to a (precured) core. With this approach thermal and/or pressure induced deformation during a lamination procedure occurs symmetrically leading to symmetric mechanical internal stress with respect to the core.

However, there are applications respectively products which do not allow a symmetric layer build-up structure or for which a symmetric build-up layer structure is disadvantageous although such applications require a low degree of warpage. Such applications/products may be for instance component carriers with embedded components and/or very thin component carriers.

SUMMARY

There may be a need for providing a component carrier with an asymmetric build-up structure which nevertheless exhibits only a small or a neglectable warpage.

This need may be met by a component carrier with an asymmetric build-up, a method for determining a design of a component carrier with an asymmetric build-up, and a method for manufacturing a component carrier with an asymmetric build-up according to aspects of the invention. Advantageous embodiments of the present invention are described by embodiments according to aspects of the invention.

According to a first aspect there is provided a component carrier with an asymmetric build-up. The provided component carrier comprises (a) a core; (b) a first stack at a first main surface of the core, the first stack comprising at least one first electrically conductive layer structure and a plurality of first electrically insulating layer structures; and (c) a second stack at a second main surface of the core, the second stack comprising at least one second electrically conductive layer structure and a plurality of second electrically insulating layer structures. In the provided component carrier at least two of the second electrically insulating layer structures are in direct contact with each other and each of these at least two second electrically insulating layer structures has a smaller thickness than and/or comprises a different (dielectric) material property than at least one of the first electrically insulating layer structures.

Overview of Embodiments

The described component carrier is based on the idea that warpage properties can be steered/controlled by adjusting the thickness of and/or selecting a proper material (property) for dielectric layers on at least one side of a core of an asymmetric build up component carrier. This surprising technical effect can be shown by simulations which allow not only for a quantitative thickness adjustment but also for a proper selection of predefined dielectric materials.

The core may be, already during manufacturing of the component carrier, a pre cured or pre hardened electrically insulating structure comprising resin. The core may have a (vertical) thickness in the range between 50 µm and 500 µm. The first and/or the second electrically insulating layer structures may each have a (vertical) thickness in between 15 µm and 100 µm.

The core may be made from a prepreg material layer comprising a fiberglass matrix wherein the fibers are impregnated with resin. The fiberglass matrix provides, in a known manner, a high mechanical stability for the core. Hence, when manufacturing the component carrier, the core may be used as a comparatively rigid mounting base for the other electrically insulating and electrically conductive layer structures, even before performing a lamination process.

The first electrically insulating layer structure and the second electrically insulating layer structure may comprise resin, optionally enforced with a fiberglass matrix.

In some embodiments the two electrically conductive layer structures, which directly contact the core, may be electrically connected by means of a laser drilled via or a mechanically drilled via. By contrast thereto, the layer-to-layer connection for the other electrically conductive layer structures is only realized by means of laser drilled vias.

The mentioned material (property) difference may result from at least one physical and/or chemical material parameter of the respective second electrically insulating layer structure as compared to the corresponding material parameter of the respective first electrically insulating layer structure. Specifically, the material (property) difference may result from different parameter values of one or more physical and/or chemical material parameters. Examples for potentially different material parameters are
- density of mass;
- elastic modulus, e.g. Young Modulus, shear modulus, bulk modulus;
- stiffness and/or compliance;
- anisotropy of any one of these elastic moduli;
- Coefficient of Thermal Expansion;
- electric parameters, e.g. dielectric constant, electromagnetic permeability, magnetic susceptibility;
- a moisture absorption rate;
- a surface polarity (which can e. g. be used to increase the adhesion of the layers and to prevent delamination and/or moisture absorption).

It is pointed out that this list is not concluding and that the mentioned warpage control can in principle be achieved by other different material properties as well.

The different materials for different electrically insulating layer structures may be chosen related to their mechanical and chemical or physical properties. In some applications the elastic modulus/Young modulus of the entire stack may be tuned. Hence, the materials for the individual electrically insulating layer structures can be chosen related to their Young modulus.

The mechanical properties for the different electrically insulating layer structures may be selected in particular in order to balance CTE mismatches within the component carrier. Hence, unwanted warpage effects can be reduced.

The different material properties may be the result of different materials or of a different behavior of one and the same material. Such a different behavior for one and the same material may be a different processing stage of the material. In this context the processing stage may be a curing stage of a resin, e.g., a so called, A, B or C stage.

In this document the term vertical thickness is a thickness measured along a direction perpendicular to the main surfaces or main plane respectively parallel to the normal vector of the main surfaces or main planes. A main surface may be defined by the surface of a layer which exhibits the largest surface area. Specifically, the main surface defines the spatial extension of the respective layer in an xy-plane being defined by an x-direction and a y-direction. The vertical thickness defines the spatial extension of the respective layer along a direction being perpendicular both to the x-direction and the y-direction. The build-up of the layer sequence defining each stack is the vertical z-direction.

In the context of this document, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In some embodiments, the stacks of first and second dielectric and conductive layer structures are a (layer) laminate which may be formed by applying mechanical pressure and/or thermal energy. The mentioned stacks may provide a plate-shaped component carrier capable of providing a large mounting surface for further components and being nevertheless very thin and compact. The term "layer structure" may particularly denote a continuous layer, a patterned layer or a plurality of non-consecutive islands within a common plane.

In some embodiments, the component carrier is shaped as a plate. This contributes to a compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In some embodiments, the component carrier is configured as one of the group consisting of a printed circuit board, a substrate (in particular an IC substrate), and an interposer.

In the context of this document, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of this document, the term "substrate" may particularly denote a small component carrier. A substrate may be a, in relation to a PCB, comparably small component carrier onto which one or more components may be mounted and that may act as a connection medium between one or more chip(s) and a further PCB. For instance, a substrate may have substantially the same size as a component (in particular an electronic component) to be mounted thereon (for instance in case of a Chip Size Package (CSP)). More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections along the above specified z-direction may be for example drill holes. These lateral and/or vertical connections are arranged within the substrate and can be used to provide electrical, thermal and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate or interposer may comprise or consist of at least a layer of glass, silicon (Si) or a photoimageable or dry-etchable organic material like epoxy-based build-up material (such as epoxy-based build-up film) or polymer compounds like polyimide, polybenzoxazole, or benzocyclobutene-functionalized polymers.

In some embodiments, an electrically insulating layer structure comprises at least one of the group consisting of resin (such as reinforced or non-reinforced resins, for instance epoxy resin or bismaleimide-triazine resin), cyanate ester resin, polyphenylene derivate, glass (in particular glass fibers, multi-layer glass, glass-like materials), prepreg material (such as FR-4 or FR-5), polyimide, polyamide, liquid crystal polymer (LCP), epoxy-based build-up film, polytetrafluoroethylene (PTFE, Teflon®), a ceramic, and a metal oxide. Teflon® is a registered mark of The Chemours Company FC of Wilmington, Delaware, U.S.A. Reinforcing structures such as webs, fibers or spheres, for example made of glass (multilayer glass) may be used as well. Although prepreg particularly FR4 are usually preferred for rigid PCBs, other materials in particular epoxy-based build-up film or photoimageable dielectric material may be used as well. For high frequency applications, high-frequency materials such as polytetrafluoroethylene, liquid crystal polymer and/or cyanate ester resins, low temperature cofired ceramics (LTCC) or other low, very low or ultra-low DK materials may be implemented in the component carrier as electrically insulating layer structure.

In some embodiments, an electrically conductive layer structure comprises at least one of the group consisting of copper, aluminum, nickel, silver, gold, palladium, and tungsten. Although copper is usually preferred, other materials or coated versions thereof are possible as well, in particular materials coated with supra-conductive material such as graphene.

According to an embodiment the first stack has a larger vertical thickness than the second stack. This may provide the advantage that the freedom of design for the described component carrier can be increased. Specifically, not only the internal structure and/or the material composition for both layer stacks may be chosen as to be different but also the overall dimension of the layers stacks may be selected in an appropriate manner depending in the specific application.

The described larger thickness of the first stack may be realized for instance with the same (dielectric) layer count of electrically insulating layer structures at both sides. Thereby, however, the thickness of one or more second electrically insulating layer structures is smaller than the thickness of one or more first electrically insulating layer structures. As will be elucidated below in more detail, two or more comparatively thin second electrically insulating layer structures, which directly adjoin each other, may form a superordinate electrically insulating layer structure at or of the second stack. In this context one superordinate electrically insulating layer structure is counted with the number of individual electrically conductive layer structures forming the superordinate electrically insulating layer structure.

Descriptively speaking, in such a configuration the asymmetry in thickness is realized by different dielectric layer thicknesses and not by a different (dielectric) layer count. However, it is mentioned that also a different (dielectric) layer count can make at least a contribution to the described different vertical thicknesses of the stacks.

According to an embodiment (i) a first number of the first electrically conductive layer structures is larger than (ii) a second number of the second electrically conductive layer structures. This may provide the advantage that the described difference in the (vertical) thickness between the first stack and the second stack can be realized in a simple and effective manner because for the formation of any electrically insulating layer structure the same (prepreg) material with the same thickness as a semifinished product can be used. Hence, when building up the component carrier layer stacks there will be no need to use different lamination processes for different layers. Only the number of electrically conductive layer structures, i.e., the so-called dielectric layer count, differs between the first stack and the second stack.

According to a further embodiment (A) a difference between (i) the number of the first electrically conductive layer structures and (ii) the number of the second electrically conductive layer structures is higher than (B) a difference between (i) the number of the first electrically insulating layer structures and (ii) the number of the second electrically insulating layer structures. This may allow to design the realize the component carrier with a high freedom of design.

According to a further embodiment the number of the first insulating layer structures and the number of the second insulating layer structures is the same. This may allow to manufacture the described component carrier in an easy and effective manner with a symmetric lamination process, wherein for each lamination step the same number of layer structures are laminated. Specifically, there is no need for a lamination step wherein a lamination takes place only at one side of the core.

According to a further embodiment the number of the first insulating layer structures is lower than the number of the second insulating layer structures. This may allow to realize with a simple and effective manufacturing process a highly asymmetric component carrier, which may be required for some applications.

According to a further embodiment the at least two, in particular at least three, of the second electrically insulating layer structures directly contact with each other. This may provide the advantage that with two or more than one lamination processes, which are respectively carried out with two outer dielectric layer structures, e.g., (i) one outer first dielectric layer structure at the top or above the (so far formed) first stack and (ii) one outer second dielectric layer structure at the bottom or below the (so far formed) second stack, a different effective dielectric layer count can be realized. Thereby it is assumed that in between two different first electrically insulating layer structures there is always formed one electrically conductive layer structure. Of course, between two adjoining second electrically insulating layer structures there is no electrically conductive layer structure in between. Hence, from a pure technical point of view of the overall behavior of the component carrier the different adjoining second electrically insulating layer structures effectively count as one single electrically insulating layer structure.

According to a further embodiment at least one of the second electrically insulating layer structures has a thickness being not more than half of a thickness of a corresponding one of the first electrically insulating layer structures. This may provide the advantage that two (or more) second electrically insulating layer structures, which directly adjoin each other, can form a superordinate electrically insulating layer structure, which is not thicker than at least one of the first electrically insulating layer structures.

In some embodiments the thickness of each one of two or more second electrically insulating layer structures is an integer fraction of the thickness of one of at least one first electrically insulating layer structures. Hence, the second stack may comprise at least approximately the same dielectric layer thicknesses as compared to the first stack. In preferred embodiments, all dielectric layers (including the superordinate electrically insulating layer structure) comprise the same thickness. Hence, the described component carrier, although having an asymmetric layer build-up, can be realized in a simple design. Hence, warpage reduction can be effected with a comparatively easy design process.

According to a further embodiment different ones of the second electrically insulating layer structures comprise different materials.

Using different material for forming different ones of the second electrically insulating layer structures may provide an additional degree of freedom for the design of the component carrier. This additional degree of freedom can be used in a beneficial manner for designing/realizing a component carrier with an extraordinary small warpage.

According to a further embodiment the component carrier further comprises at least one component which is embedded at least partially in at least one of (i) the first stack, (ii) the second stack, and (iii) the core.

The embedded component may provide the described component carrier with more or additional functionality. Hence, the integration density of an electronic assembly being mounted at the component carrier can be increased. Of course, such a highly integrated electronic assembly can comprise, in addition to one or more embedded components, in a known manner also surface mounted electronic components.

In this context it is pointed out that an embedded component of course modifies the internal layer structure of a multilayer component carrier. This is for instance because the lateral dimension of layers, wherein the component is embedded, is different to the lateral dimension of layers, which are arranged above or below the embedded component. Further, the material of the embedded component and/or soft materials which are used for embedding the component in a smooth manner, have different physical and/or chemical parameters, e.g., a different Coefficient of Thermal Expansion (CTE). Hence, an embedded component of course has an impact on the warpage of the component carrier. In this respect the asymmetrically build up component carrier described in this document can be designed in such a manner that warpage effects caused by the embedded component and/or by embedding the component during manufacture can be compensated at least approximately. Hence, also component carriers with at least one embedded component can be realized which have only a very small warpage.

The at least one component can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an optical element (for instance a lens), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be a substrate, an interposer or a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electromagnetic radiation propagating from an environment, may be used as a component.

According to a further aspect there is provided a method for determining a design of a component carrier with asymmetric build-up, the method comprising (a) modeling the component carrier to be designed with (a1) a first stack at a first main surface of a core, the first stack comprising at least one first electrically conductive layer structure and a plurality of first electrically insulating layer structures, and with (a2) a second stack at a second main surface of the core, the second stack comprising at least one second electrically conductive layer structure and a plurality of second electrically insulating layer structures. The method further comprises (b) adjusting a warpage-related characteristics of the component carrier to be designed by configuring at least two of the second electrically insulating layer structures, which are in direct contact with each other, such that each one of these at least two second electrically insulating layer structures has a smaller thickness than and/or comprises a different (dielectric) material property than at least one of the first electrically insulating layer structures.

Also, the described design determination method is based on the idea that warpage properties can be steered/controlled by adjusting the thickness of and/or selecting a proper material for dielectric layers on at least one side of a core of a component carrier having an asymmetric build-up layer structure. As has already been mentioned above, simulations, which can be carried out with a software program developed by the inventors, show the surprising effects of the asymmetric design of the component carrier on the (expected) warpage of the component carrier. Hence, these simulations can be used for adapting/adjusting the design of the component carrier in order to be able to manufacture a component carrier having a low or neglectable warpage.

According to an embodiment the method further comprises simulating the warpage-related characteristics of the component carrier to be designed, wherein adjusting the warpage-related characteristics of the component carrier to be designed is based on a result of the simulating. Using warpage related simulation results may allow to adjust the warpage-related characteristics in such a manner that a component carrier design can be determined, which is associated with a low warpage component carrier.

According to a further embodiment the warpage-related characteristics are adjusted such that they meet at least one predefined warpage-related criterion using thickness and/or (dielectric) material of the second electrically insulating layer structures as a fitting parameter. Alternatively or in combination, a density of the at least one first electrically conductive layer structure and/or the at least one second electrically conductive layer structure may be used as a fitting parameter.

The described predefined warpage-related criterion may allow to facilitate and in particular to automatize the component carrier design process. The design process can be stopped as soon as a design which meets the predefined warpage-related criterion is found.

In this context the term "density" may be the density of mass which of course has, apart from the thickness of the respective electrically conductive layer structure, a strong impact on the mechanical properties in particular because the vibration characteristic of any physical structure/element depends on its mass. Hence, adjusting the density of at least one first/second electrically conductive layer structure represents a further measure to adapt the mechanical (and indirectly also the warpage-related characteristics) of the entire component carrier.

According to a further embodiment the at least one predefined warpage-related criterion comprises at least one of the group consisting of (i) minimizing an overall warpage of the component carrier, and (ii) minimizing a central warpage of the component carrier in a central region of the component carrier. This may allow to focus, with the design process, towards a warpage in predefined spatial regions of component carrier. This might become of advantage in particular in applications where the component carrier is a panel type component carrier which in a later manufacturing process is singularized into a plurality of individual component carriers. Hence, the described warpage control can be exploited in such a manner that within one panel different individual component carriers with different warpage properties can be manufactured in a pre-known manner. For instance, individual component carriers with a higher warpage can be used for electronic assemblies which are less critical with respect to warpage than other individual component carriers with a smaller warpage, wherein the latter can be used for building up high quality electronic assemblies.

According to a further embodiment the warpage-related characteristics are adjusted under consideration of the at least one embedded component. This means that the influence of an embedded component on the warpage property/warpage behavior of the component carrier to be designed can be taken into account in order to find a design for the component carrier with at least one embedded component which exhibits a minimum overall warpage. In preferred application the warpage-related characteristic is adjusted in such a manner that it completely or at least partially compensates the warpage caused by the embedded component and/or the warpage caused by a process of embedding the embedded component in a subsequent component carrier manufacturing procedure.

According to a further embodiment the method further comprises determining the design by adapting the process parameters of at least one process of laminating (i) a further one of the first electrically insulating layer structures to the first stack and/or (ii) a further one of the second electrically insulating layer structures to the second stack.

Process parameters may be individually adjusted for at least one lamination process, which is carried out at or within the first stack and/or the second stack. Process parameters may be, e.g., lamination temperature, lamination pressure, duration of lamination In some applications, the process parameters of each lamination process are adapted/chosen in an appropriate manner. Lamination can include a lamination of more than one first or second electrically insulating layer structure. Further, for a lamination process an electrically insulating layer structure can be processed together with a so called prepreg layer structure having, as a semifinished product, formed an electrically conductive layer structure at a surface of the prepreg layer structure.

According to a further embodiment the method further comprises determining the design by adapting the process parameters of at least one process of laminating (i) a further one of the first electrically insulating layer structures and a further one of the at least one first electrically conductive layer structure to the first stack and (ii) a further one of the second electrically insulating layer structures is laminated to the second stack without laminating a further one of the at least one second electrically conductive layer structure to the second stack.

Descriptively speaking, the lamination according to this embodiment is characterized in such a manner that at a first side of the core, where the first stack is formed, a (further one) first electrically insulating layer structure is laminated together with a (further one) first electrically conductive layer structure. Further, at an opposite second side of the core, where the second stack is formed, a (further one) second electrically insulating layer structure is laminated without any conductive layer structure. Hence, there are at least two second electrically insulating layer structures which directly adjoin each other such that a superordinate second electrically insulating layer structure is formed.

Such a superordinate second electrically insulating layer structure may allow to have the same number of lamination processes at both sides of the core whereas at the second side at least two electrically insulating layer structures directly adjoin each other because there is no electrically conductive layer structure in between. Hence, the second electrically insulating layer structure and at least one further second electrically insulating layer structure, which directly adjoin each other, may form a superordinate second electrically insulating layer structure.

According to a further embodiment the further one of the first electrically insulating layer structures and the further one of the second electrically insulating layer structures have a different thickness. This may allow to adjust the thickness not only of the individual second electrically insulating layer structure but also of the superordinate second electrically insulating layer structure mentioned above.

According to a further embodiment a first thickness of the further one of the first electrically insulating layer structures is at least approximately an integer multiple of a second thickness of the further one of the second electrically insulating layer structures. This may allow to build up a superordinate second electrically insulating layer structure with a thickness which corresponds to the thickness of an individual further one of the first electrically insulating layer structures. This may provide the advantage that despite of its asymmetry the described component carrier can be manufactured with a generally symmetric overall lamination procedure, wherein each lamination step comprises a first lamination at the first stack and a second lamination at the second stack.

According to a further aspect there is provided a manufacturing method for manufacturing a component carrier with an asymmetric build-up. The manufactured component carrier may be any component carrier as described above. The provided manufacturing method comprises (a) carrying out the method as described above for determining a design of a component carrier and (b) manufacturing the component carrier based on the adjusted warpage-related characteristics.

The described component carrier manufacturing method is based on the idea that with the help of the above-described design determination method a component carrier with an extraordinary low warpage behavior can be manufactured.

In some embodiments, the component carrier is a laminate-type component carrier. Specifically, the component carrier may be a compound of multiple layer structures which are stacked and connected together by applying a pressing force and/or heat.

After processing interior layer structures of the component carrier, it is possible to cover (in particular by lamination) one or both opposing main surfaces of the processed layer structures symmetrically or asymmetrically with one or more further electrically insulating layer structures and/or electrically conductive layer structures. In other words, a build-up may be continued until a desired number of layers is obtained.

After having completed formation of a stack of electrically insulating layer structures and electrically conductive layer structures, it is possible to proceed with a surface treatment of the obtained layers structures or component carrier.

For instance, an electrically insulating solder resist may be applied to one or both opposing main surfaces of the layer stack or component carrier in terms of surface treatment. For instance, it is possible to form such as solder resist on an entire main surface and to subsequently pattern the layer of solder resist so as to expose one or more electrically conductive surface portions which shall be used for electrically coupling the component carrier to an electronic periphery. The surface portions of the component carrier remaining covered with solder resist may be efficiently protected against oxidation or corrosion. This may apply in particular for surface portions containing copper.

It is also possible to apply a surface finish selectively to exposed electrically conductive surface portions of the component carrier in terms of surface treatment. Such a surface finish may be an electrically conductive cover material on exposed electrically conductive layer structures (such as pads, conductive tracks, etc., in particular comprising or consisting of copper) on a surface of a component carrier. If such exposed electrically conductive layer structures are left unprotected, then the exposed electrically conductive component carrier material (in particular copper) might oxidize, making the component carrier less reliable. A surface finish may then be formed for instance as an interface between a surface mounted component and the component carrier. The surface finish has the function to protect the exposed electrically conductive layer structures (in particular copper circuitry) and enable a joining process with one or more components, for instance by soldering. Examples for appropriate materials for a surface finish are Organic Solderability Preservative (OSP), Electroless Nickel Immersion Gold (ENIG), gold (in particular Hard Gold), chemical tin, nickel-gold, nickel-palladium, ENIPIG (Electroless Nickel Immersion Palladium Immersion Gold, etc.

According to an embodiment manufacturing the component carrier based on the adjusted warpage-related characteristics comprises performing a plurality of processes of laminating at the first stack and/or at the second stack within one process step. This may provide the advantage that the component carrier described above can be manufactured in a fast and effective manner. In this context it should be recognized that for each lamination step several sub-steps may be required such as adding further layer structure(s), applying heat, applying pressure, etc.

According to a further embodiment manufacturing the component carrier based on the adjusted warpage-related characteristics comprises performing a at least two of processes of laminating at the first stack and/or at the second stack within different process steps. This may provide the advantage that the component carrier described above can be manufactured in such a manner that for different individual layer structures, in particular different individual electrically insulating layer structures, different lamination process parameters can be used. Hence, for every individual electrically insulating layer structure an optimized lamination process can be carried out.

It has to be noted that embodiments have been described with reference to different subject matters. In particular, some embodiments have been described with reference to method type claims whereas other embodiments have been described with reference to apparatus type claims. However, a person skilled in the art will gather from the above and the following description that, unless other notified, in addition to any combination of features belonging to one type of subject matter also any combination between features relating to different subject matters, in particular between features of the method type claims and features of the apparatus type claims is considered as to be disclosed with this document.

The aspects defined above and further aspects are apparent from the examples of embodiment to be described hereinafter and are explained with reference to the examples of embodiment. The invention will be described in more detail hereinafter with reference to examples of embodiment but to which the invention is not limited.

BRIEF DESCRIPTION OF THE DRAWINGS

FIG. 1A, FIG. 1B, and FIG. 1C illustrate in a schematic representation a manufacturing method for a component carrier with an asymmetric build-up in accordance with an embodiment.

FIG. 2 shows a schematic representation of a component carrier having an asymmetric 5-2-2 configuration.

FIG. 3 shows a schematic representation of a component carrier having an asymmetric 5-2-3 configuration.

FIG. 4 shows a schematic representation of a component carrier having an asymmetric 4-2-2 configuration.

FIG. 5 shows a schematic representation of a component carrier having an asymmetric 3-2-2 configuration.

FIG. 6A and FIG. 6B show a microscopic image together with an enlarged section of a manufactured component carrier having an asymmetric 4-2-2 configuration, wherein a component is embedded within the asymmetric component carrier.

DETAILED DESCRIPTION OF ILLUSTRATED EMBODIMENTS

The illustrations in the drawings are schematically presented. It is noted that in different figures, similar or identical elements or features are provided with the same reference signs or with reference signs, which are different from the corresponding reference signs only within the first digit. In order to avoid unnecessary repetitions, elements or features, which have already been elucidated with respect to a previously described embodiment, are not elucidated again at a later position of the description.

Further, spatially relative terms, such as "front" and "back", "above" and "below", "left" and "right", et cetera are used to describe an element's relationship to another element or other elements as illustrated in the Figures. Thus, the spatially relative terms may apply to orientations in use which differ from the orientation depicted in the Figures. Obviously, all such spatially relative terms refer to the orientation shown in the Figures only for ease of description and are not necessarily limiting as an apparatus according to an embodiment can assume orientations different than those illustrated in the Figures when in use.

Before referring in detail to the individual figures of the drawing it is pointed out that throughout this document electrically conductive layer structures, which according to all embodiments described below, are made from copper (Cu), are indicated with a reference numeral having the first character "L". Further, dielectric respectively electrically insulating layer structures are indicated with a reference numeral having the first character "D". Furthermore, for the sake of briefness layer structures are also denominated simply structures.

FIG. 1 illustrates in a schematic representation a manufacturing method for a component carrier with an asymmetric build-up in accordance with an embodiment. The method starts with providing a (cured) core C. Next, at an upper first side of the core C there is laminated a layer sequence comprising layer (structures) L1, D1, and L2. The layers L1 and L2 are electrically conductive layers whereas D1 is a dielectric or electrically insulating layer. Preferably simultaneously there are laminated, at a lower second side of the core C, respective corresponding conductive/copper layers L1' and L2' as well as a dielectric layer D1'. It is pointed out that until now the lamination procedure or at least the structural result of the lamination procedure is completely symmetric with respect to the core C.

Next, in an asymmetric procedure there is laminated at the currently top surface of the multilayer structure a dielectric layer D2 and a copper layer L3. At the opposing bottom surface there is laminated a dielectric layer D2', which comprises, compared to the dielectric layer D2, a smaller vertical thickness. According to the exemplary embodiment described here the vertical thickness of the dielectric layer D2' is one third of the vertical thickness of the layer D2. FIG. 1(a) shows the so far manufactured structure, which is an intermediate product of the entire manufacturing process.

Next, as can be seen from a direct comparison between FIG. 1A and FIG. 1B there are laminated, at the currently top surface of the intermediate product shown in FIG. 1A, a dielectric layer D3 and a copper layer L4. At the opposite second side there are laminated at the currently bottom surface a further dielectric layer D3' having the same (vertical) thickness as the dielectric layer D2'. The structure shown in FIG. 1B is a further respectively the next intermediate product of the manufacturing process described here.

Next, as can be seen from a direct comparison between FIG. 1B and FIG. 1C there are laminated, at the currently top surface of the intermediate product shown in FIG. 1B, a dielectric layer D4 and a copper layer L5. At the opposite second side there are laminated at the currently bottom surface a further dielectric layer D4' having again the same (vertical) thickness as the dielectric layer D2'. Since the dielectric layers D2', D3', and D4' directly adjoin each other there has been formed a superordinate dielectric layer having the same thickness as, e.g., the dielectric layer D2. In a next common lamination step or preferably together or simultaneously with the lamination of at least the layer L5 there is laminate a bottom copper layer L3'.

As can be taken from FIG. 1C, the result of the manufacturing method described here is a component carrier CC having an asymmetric build-up structure. Specifically, above or at a first or upper main surface of the core C there has been formed a first stack S1. Below or at a second or lower main surface of the core C there has been formed a second stack S2. The second stack S2 has a smaller vertical thickness the first stack S1. The first stack S1 comprises in an alternating sequence four dielectric layers D1, D2, D3, and D4 and five electrically conductive layers L1, L2, L3, L4, and L5. The second stack S2 comprises in an alternating sequence two dielectric layers D1' and the superordinate layer consisting of the layers D2', D3', and D4'.

As can be further taken from FIG. 1C, when taking into account only layer L1, layer L1', layer D1, layer D1', layer L2, layer L2', layer D2, the superordinate layer D2', D3', D4', layer L3, and layer L3', this inner region of the component carrier is symmetric. Hence, the layers D3, L4, D4, and L5 make the build-up of the component carrier CC asymmetric. It is pointed out that this asymmetry is achieved with the same number of dielectric lamination steps, because according to the exemplary embodiment described here the superordinate layer D2', D3', D4' has been formed with three individual lamination steps. In preferred embodiments the lamination of the (sub) layer D2' is carried out together with the lamination of the layer D2. Further, the lamination of the (sub) layer D3' is carried out together with the lamination of the layer D3 and the lamination of the (sub) layer D4' is carried out together with the lamination of the layer D4.

It is pointed out that in addition to the two conductive layers L1 and L1', which directly adjoin the core C, the configuration of the asymmetric component carrier CC comprises four conductive layers L2, L3, L4, and L5 on one side of the core C and two conductive layers L2' and L3' on the opposing other side of the core. Since the two inner conductive layers L1 and L1' can be considered as to represent a part of a carrier structure the configuration of the asymmetric component carrier CC build-up can be denominated a 4-2-2 configuration.

FIG. 2 shows a schematic representation of a component carrier having an asymmetric 5-2-2 build-up configuration. This configuration differs from the 4-2-2 configuration shown in FIG. 1C in that that at the first upper side there has been additionally formed a further dielectric layer D5 and a further copper layer L6. At the second bottom side there has been formed an additional dielectric layer D5' and an additional copper layer L3'. Further, according to the embodiment described here the dielectric layers D2', D3', D4', and D5' each have a thickness which is only one quarter of the thickness of the other dielectric layers. Hence, there has been formed a superordinate dielectric layer consisting of the dielectric (sub-) layers D2', D3', D4', and D5'.

Further, the component carrier CC shown in FIG. 2 further comprises two solder masks SM, one at the upper surface and the other one at the lower surface of the component carrier CC.

FIG. 3 shows a schematic representation of a component carrier having an asymmetric 5-2-3 configuration. This means that apart from the two inner layers L1 and L1' directly adjoining the core C there are five conductive layers L2 to L6 above the core and three conductive layers below the core. In accordance with the embodiment shown in FIG. 1C, there is again a superordinate dielectric layer consisting of three sublayers, which are here denominated with D3', D4', and D5'. In accordance with the embodiment shown in FIG. 2, the component carrier CC of FIG. 3 also comprises solder masks at the upper respectively lower surface.

FIG. 4 shows a schematic representation of a component carrier having an asymmetric 4-2-2 configuration. The only difference compared to the embodiment shown in FIG. 1C is that here there have been added two solder masks at the outer surface of the component carrier CC.

FIG. 5 shows a schematic representation of a component carrier having an asymmetric 3-2-2 configuration. Here, one of the two dielectric layers below the core is a superordinate dielectric layer consisting of two dielectric sublayers. Again, a solder mask has been formed both at the upper surface and at the lower surface of the component carrier CC, which comprises again an asymmetric overall build-up layer structure.

FIG. 6 shows a Scanning Electron Microscope (SEM) image of a manufactured component carrier CC having an asymmetric 4-2-2 configuration. FIG. 6A shows the component carrier CC along its entire vertical thickness. FIG. 6B shows an enlarged section. In FIG. 6A the enlarged section of FIG. 6B is indicated with a dashed box.

By contrast to the embodiments described above, the component carrier CC of FIG. 6 comprises an embedded (electronic) component Comp. The component Comp is embedded within a not depicted core of the component carrier CC.

A first stack S1 in the upper region of the component carrier CC comprises in accordance with the 4-2-2 configuration four conductive layers L1, L2, L3, and L4. A second stack S2 in the lower region of the component carrier CC comprises two conductive layers, a first conductive layer L1' and a second conductive layer L2'. Both stacks S1 and S2 again comprise an alternating sequence of copper layers and dielectric layers and further have different vertical thicknesses. In addition, according to the exemplary embodiment described here, both stacks S1 and S2 comprise, respectively at its outer surface, a further layer SM and SM', respectively. These layers are known solder mask layers.

It is pointed out that by contrast to the embodiments described above the two layer stacks S1 and S2 start, beginning from the interior of the component carrier CC, with a dielectric layer D1 and D1', respectively. This may allow for a smooth embedding of the component Comp.

Further, as can be taken from the SEM image of FIG. 6A, there are two outermost layers X1 and X1' which are formed at the two layers SM and SM', respectively. These most outer layers X1 and X1' are also per se known solder masks which, according to the embodiments described here, protect inner layers. Protected layers may be for instance copper foils, which are protected from being directly exposed to the atmosphere and being oxidized. Further, with the outer solder mask layers copper foils can be prevented from accidentally being touched by solder, which could affect the function of the component carrier.

It should be noted that the term "comprising" does not exclude other elements or steps and the article "a" or "an" does not exclude a plurality. Also, elements described in association with different embodiments may be combined.

Implementation of the invention is not limited to the preferred embodiments shown in the figures and described above. Instead, a multiplicity of variants are possible which variants use the solutions shown and the principle according to the invention even in the case of fundamentally different embodiments.

LIST OF REFERENCE SIGNS

CC component carrier
C core
Comp embedded component
L1-L5 electrically conductive layer structure/copper layer structure
L1'-L4' electrically conductive layer structure/copper layer structure
D1-D5 electrically insulating layer structure
D1'-D5' electrically insulating layer structure
S1 first stack
S2 second stack
SM, SM' solder mask
X1, X1' solder mask

The invention claimed is:

1. A component carrier with an asymmetric build-up, the component carrier comprising:
    a core;
    a first stack at a first main surface of the core, the first stack comprising at least one first electrically conductive layer structure and a plurality of first electrically insulating layer structures; and
    a second stack at a second main surface of the core, the second stack comprising at least one second electrically conductive layer structure and a plurality of second electrically insulating layer structures;
    wherein at least two of the second electrically insulating layer structures are in direct contact with each other and each one of these at least two second electrically insulating layer structures has a smaller thickness than and/or comprises a different material property than at least one of the first electrically insulating layer structures;
    wherein the first electrically insulating layer structures and the second electrically insulating layer structures extend over an entire dimension of the main surfaces;
    wherein at least one of the at least two of the second electrically insulating layer structures are free of a direct contact to an electrically conductive trace and/or pad;
    wherein the first main surface of the core is covered by one of the at least one first electrically conductive layer structure and the second main surface of the core is covered by one of the at least one second electrically conductive layer structure;
    wherein each one of the first stack and the second stack comprise a laminated layer sequence;
    wherein a material of the first insulating layer structures and a material of the second insulating layer structures is the same.

2. The component carrier as set forth in claim 1, wherein the first stack has a larger vertical thickness than the second stack.

3. The component carrier as set forth in claim 1, wherein a first number of the first electrically conductive layer structures is larger than a second number of the second electrically conductive layer structures.

4. The component carrier as set forth in claim 1, wherein a difference between (i) the number of the first electrically conductive layer structures and (ii) the number of the second electrically conductive layer structures is higher than a difference between (i) the number of the first electrically insulating layer structures and (ii) the number of the second electrically insulating layer structures.

5. The component carrier as set forth in claim 1, wherein the component carrier comprises at least one of the following features:
    the number of the first insulating layer structures and the number of the second insulating layer structures is the same;
    the number of the first insulating layer structures is lower than the number of the second insulating layer structures;
    the at least two of the second electrically insulating layer structures directly contact with each other.

6. The component carrier as set forth in claim 1, wherein at least one of the second electrically insulating layer structures has a thickness being not more than half of a thickness of a corresponding one of the first electrically insulating layer structures.

7. The component carrier as set forth in claim 1, wherein different ones of the second electrically insulating layer structures comprise different materials.

8. The component carrier as set forth in claim 1, wherein the component carrier further comprises:
- at least one component which is embedded at least partially in at least one of (i) the first stack, (ii) the second stack, and (iii) the core.

9. A method for determining a design of a component carrier with an asymmetric build-up, the method comprising:
- modeling the component carrier to be designed with
  a first stack at a first main surface of a core, the first stack comprising at least one first electrically conductive layer structure and a plurality of first electrically insulating layer structures, and with a second stack at a second main surface of the core, the second stack comprising at least one second electrically conductive layer structure and a plurality of second electrically insulating layer structures; and
- adjusting at least one warpage-related characteristic of the component carrier to be designed by configuring at least two of the second electrically insulating layer structures, which are in direct contact with each other, such that each one of these at least two second electrically insulating layer structures has a smaller thickness than and/or comprises a different material property than at least one of the first electrically insulating layer structures;
- wherein the first electrically insulating layer structures and the second electrically insulating layer structures extend over an entire dimension of the main surfaces;
- wherein at least one of the at least two of the second electrically insulating layer structures are free of a direct contact to an electrically conductive trace and/or pad;
- wherein the first main surface of the core is covered by one of the at least one first electrically conductive layer structure and the second main surface of the core is covered by one of the at least one second electrically conductive layer structure;
- wherein each one of the first stack and the second stack comprise a laminated layer sequence;
- wherein a material of the first insulating layer structures and a material of the second insulating layer structures is the same.

10. The method as set forth in claim 9, the method further comprising:
- simulating the warpage-related characteristic of the component carrier to be designed,
- wherein adjusting the warpage-related characteristic of the component carrier to be designed is based on a result of the simulating.

11. The method as set forth in claim 9, wherein the warpage-related characteristics are adjusted such that they meet at least one predefined warpage-related criterion using, as a fitting parameter, at least one of
- (i) the thickness and/or the material property of the second electrically insulating layer structures and
- (ii) a density of the at least one first electrically conductive layer structure and/or the at least one second electrically conductive layer structure.

12. The method as set forth in claim 11, wherein the at least one predefined warpage-related criterion comprises at least one of the group consisting of
- (i) minimizing an overall warpage of the component carrier, and
- (ii) minimizing a central warpage of the component carrier in a central region of the component carrier.

13. The method as set forth in claim 9, wherein the warpage-related characteristic is adjusted under consideration of the at least one embedded component.

14. The method as set forth in claim 9, the method further comprising:
- determining the design by adapting the process parameters of at least one process of laminating
  (i) a further one of the first electrically insulating layer structures to the first stack and/or
  (ii) a further one of the second electrically insulating layer structures to the second stack.

15. The method as set forth in claim 9, the method further comprising:
- determining the design by adapting the process parameters of at least one process of laminating
  (i) a further one of the first electrically insulating layer structures and a further one of the at least one first electrically conductive layer structure to the first stack and
  (ii) a further one of the second electrically insulating layer structures is laminated to the second stack without laminating a further one of the at least one second electrically conductive layer structure to the second stack.

16. The method as set forth in claim 15, wherein the further one of the first electrically insulating layer structures and the further one of the second electrically insulating layer structures have a different thickness.

17. The method as set forth in claim 16, wherein a first thickness of the further one of the first electrically insulating layer structures is at least approximately an integer multiple of a second thickness of the further one of the second electrically insulating layer structures.

18. A manufacturing method for manufacturing a component carrier with an asymmetric build-up, the manufacturing method comprising:
- (A) carrying out a method for determining a design of a component carrier with an asymmetric build-up, wherein the method comprises
  modeling the component carrier to be designed with
  a first stack at a first main surface of a core, the first stack comprising at least one first electrically conductive layer structure and a plurality of first electrically insulating layer structures, and with
  a second stack at a second main surface of the core, the second stack comprising at least one second electrically conductive layer structure and a plurality of second electrically insulating layer structures; and
  adjusting a warpage-related characteristic of the component carrier to be designed by configuring at least two of the second electrically insulating layer structures, which are in direct contact with each other, such that each one of these at least two second electrically insulating layer structures has a smaller thickness than and/or comprises a different material property than at least one of the first electrically insulating layer structures; and
- (B) manufacturing the component carrier based on the adjusted warpage-related characteristic;
  wherein the first electrically insulating layer structures and the second electrically insulating layer structures extend over an entire dimension of the main surfaces;

wherein at least one of the at least two of the second electrically insulating layer structures are free of a direct contact to an electrically conductive trace and/or pad;

wherein the first main surface of the core is covered by one of the at least one first electrically conductive layer structure and the second main surface of the core is covered by one of the at least one second electrically conductive layer structure;

wherein each one of the first stack and the second stack comprise a laminated layer sequence;

wherein a material of the first insulating layer structures and a material of the second insulating layer structures is the same.

19. The manufacturing method as set forth in claim 18, wherein manufacturing the component carrier based on the adjusted warpage-related characteristic comprises at least one of performing a plurality of processes of laminating at the first stack within one process step;

performing a plurality of processes of laminating at the second stack within one process step.

20. The manufacturing method as set forth in claim 18, wherein manufacturing the component carrier based on the adjusted warpage-related characteristic comprises at least one of performing at least two of processes of laminating at the first stack within different process steps; and performing at least two of processes of laminating at the second stack within different process steps.

* * * * *